United States Patent
Choi et al.

(10) Patent No.: US 10,215,817 B2
(45) Date of Patent: Feb. 26, 2019

(54) INSULATED RF COIL AND MAGNETIC RESONANCE IMAGING APPARATUS INCLUDING THE SAME

(71) Applicant: Samsung Electronics Co., Ltd., Suwon-si (KR)

(72) Inventors: Kyung Moo Choi, Suwon-si (KR); Hae-Gweon Park, Suwon-si (KR); Ju Hyung Lee, Gwacheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 435 days.

(21) Appl. No.: 15/042,485

(22) Filed: Feb. 12, 2016

(65) Prior Publication Data

US 2017/0074955 A1 Mar. 16, 2017

(30) Foreign Application Priority Data

Sep. 15, 2015 (KR) .................. 10-2015-0130146

(51) Int. Cl.
*G01R 33/34* (2006.01)
*G01R 33/3415* (2006.01)

(52) U.S. Cl.
CPC .... *G01R 33/34015* (2013.01); *G01R 33/34007* (2013.01); *G01R 33/3415* (2013.01)

(58) Field of Classification Search
CPC ........ G01R 33/34015; G01R 33/34007; G01R 33/3415
See application file for complete search history.

(56) References Cited

U.S. PATENT DOCUMENTS

| 5,348,010 A * | 9/1994 | Schnall ............ A61B 5/055 600/421 |
| 6,501,980 B1* | 12/2002 | Carlon ............. A61B 5/055 324/318 |
| 7,945,308 B2* | 5/2011 | Tropp .............. A61B 5/055 600/420 |

(Continued)

FOREIGN PATENT DOCUMENTS

| JP | 6-319714 | 11/1994 |
| JP | 10-204634 | 8/1998 |
| JP | 2001-95776 | 4/2001 |

OTHER PUBLICATIONS

Korean Office Action dated Aug. 30, 2016 in Korean Patent Application No. 10-2015-0130146.

(Continued)

*Primary Examiner* — G.M. A Hyder
(74) *Attorney, Agent, or Firm* — Staas & Halsey LLP

(57) ABSTRACT

An RF coil has an improved structure to prevent an excessive heat from being transferred to an object, and a magnetic resonance imaging apparatus includes the same. The MRI apparatus includes an RF coil configured to receive an RF signal, wherein the RF coil may include a first cover configured to allow thermal insulation material to be injected into the inside thereof, a second cover configured to allow thermal insulation material to be injected into the inside thereof and detachably coupled to the first cover to form an inner space with the first cover, and at least one circuit board disposed in the inner space and on which a circuit element configured to receive the RF signal is mounted.

10 Claims, 8 Drawing Sheets

(56) References Cited

U.S. PATENT DOCUMENTS

| | | | |
|---|---|---|---|
| 2002/0101241 A1* | 8/2002 | Chui | G01R 33/34084 |
| | | | 324/319 |
| 2006/0208734 A1* | 9/2006 | Xue | G01R 33/341 |
| | | | 324/318 |
| 2008/0129295 A1* | 6/2008 | Carlton | G01R 33/341 |
| | | | 324/318 |
| 2012/0293175 A1 | 11/2012 | Wosik et al. | |
| 2015/0011870 A1* | 1/2015 | Piferi | A61B 19/026 |
| | | | 600/422 |
| 2017/0067973 A1* | 3/2017 | Hyun | G01R 33/34007 |
| 2018/0136293 A1* | 5/2018 | Xie | G01R 33/34084 |

OTHER PUBLICATIONS

Korean Office Action dated Feb. 27, 2017 in Korean Patent Application No. 10-2015-0130146.
Korean Office Action dated Aug. 31, 2017 in Korean Patent Application No. 10-2015-0130146.
Korean Notice of Allowance dated Oct. 20, 2017 in Korean Patent Application No. 10-2015-0130146.

* cited by examiner

500a

500b

INSULATED RF COIL AND MAGNETIC RESONANCE IMAGING APPARATUS INCLUDING THE SAME

CROSS-REFERENCE TO RELATED APPLICATIONS

This application claims the priority benefit of Korean Patent Application No. 10-2015-0130146, filed on Sep. 15, 2015 in the Korean Intellectual Property Office, the disclosure of which is incorporated herein by reference.

BACKGROUND

1. Field

The following description relates to a Radio Frequency (RF) coil and a magnetic resonance imaging apparatus including the same, and more particularly, to an RF coil having an improved structure to prevent excessive heat from being transferred to an object, and a magnetic resonance imaging apparatus including the same.

2. Description of the Related Art

In general, medical imaging apparatuses are configured to acquire information on a patient and provide an image. Medical imaging apparatuses include X-ray apparatuses, ultrasonic diagnostic apparatuses, computed tomography apparatuses, and magnetic resonance imaging apparatuses.

Among these, magnetic resonance imaging apparatuses play an important role in fields using medical imaging because they have relatively free image capture conditions and provide excellent contrast in soft tissues and various diagnostic information images.

Magnetic Resonance Imaging (MRI) represents an image indicating the density of atomic nuclei and physical and chemical properties by causing nuclear magnetic resonance of hydrogen atomic nuclei in the body using Radio Frequencies (RF) as specific ionization radiation and magnetic fields that are not harmful to human bodies.

Particularly, the MRI apparatus images an object by converting energy discharged from atomic nuclei into a signal by supplying a specified frequency and energy to the atomic nuclei in a state in which a specified magnetic field is applied to the inside of a gantry.

At this time, an RF coil may be used to receive energy discharged from the atomic nuclei, and the RF coil may be separated from a patient table. The RF coil is usually kept separated from the patient table, and the RF coil may be connected to the patient table when taking a magnetic resonance image.

The RF coil may be overheated in the MRI procedure. If the RF coil is overheated above a certain level, the patient may suffer from the burn. Particularly, when the patient is a child, the patient has a soft skin and thus is more vulnerable to the burn.

SUMMARY

It is an aspect of the present disclosure to provide an RF coil having an improved structure configured to prevent heat generated in the RF coil from being directly transferred to a patient, and a magnetic resonance imaging apparatus including the same.

It is an aspect of the present disclosure to provide an RF coil having an improved structure configured to be easily repaired, and a magnetic resonance imaging apparatus including the same.

Additional aspects of the disclosure will be set forth in part in the description which follows and, in part, will be obvious from the description, or may be learned by practice of the invention.

In accordance with an aspect of the present disclosure, an MRI apparatus includes an RF coil configured to receive an RF signal, wherein the RF coil may include a first cover configured to allow thermal insulation material to be injected into the inside thereof, a second cover configured to allow thermal insulation material to be injected into the inside thereof and detachably coupled to the first cover to form an inner space with the first cover, and at least one circuit board disposed in the inner space and on which a circuit element configured to receive the RF signal is mounted.

The first cover and the second cover may include at least one thermal insulation material nozzle, respectively, wherein the thermal insulation material may be injected into the inside of the first cover and the second cover through the at least one thermal insulation material nozzle.

The RF coil may further include at least one coupling unit configured to detachably couple the first cover to the second cover.

The at least one coupling unit may include a first coupling part formed on any one of the first cover and the second cover and provided with a protrusion unit, and a second coupling part formed on the other of the first cover and the second cover and provided with a connecting groove to which the protrusion is coupled.

The first coupling part may be integrally formed with any one of the first cover and the second cover, and the second coupling part may be integrally formed with the other of the first cover and the second cover.

The at least one coupling unit may be disposed along at least one portion of an edge of the RF coil.

The at least one coupling unit may be continuously disposed along at least one portion of an edge of the RF coil.

The first cover and the second cover may be flexible to be bent to fit the shape of an object, which is to be scanned.

The at least one of the first cover and the second cover may include at least one of Polyvinyl chloride (PVC) and Teflon.

The at least one of the first cover and the second cover may include a rigid unit wherein the rigid unit may be provided with a handle.

BRIEF DESCRIPTION OF THE DRAWINGS

These and/or other aspects of the present disclosure will become apparent and more readily appreciated from the following description of the embodiments, taken in conjunction with the accompanying drawings of which.

DETAILED DESCRIPTION

Hereinafter embodiments of the present disclosure will be described with reference to drawings. In the following detailed description, the terms of "front end", "rear end", "upper portion", "lower portion", "upper end", "lower end" and the like may be defined by the drawings, but the shape and the location of the component is not limited by the term.

Figure 1:
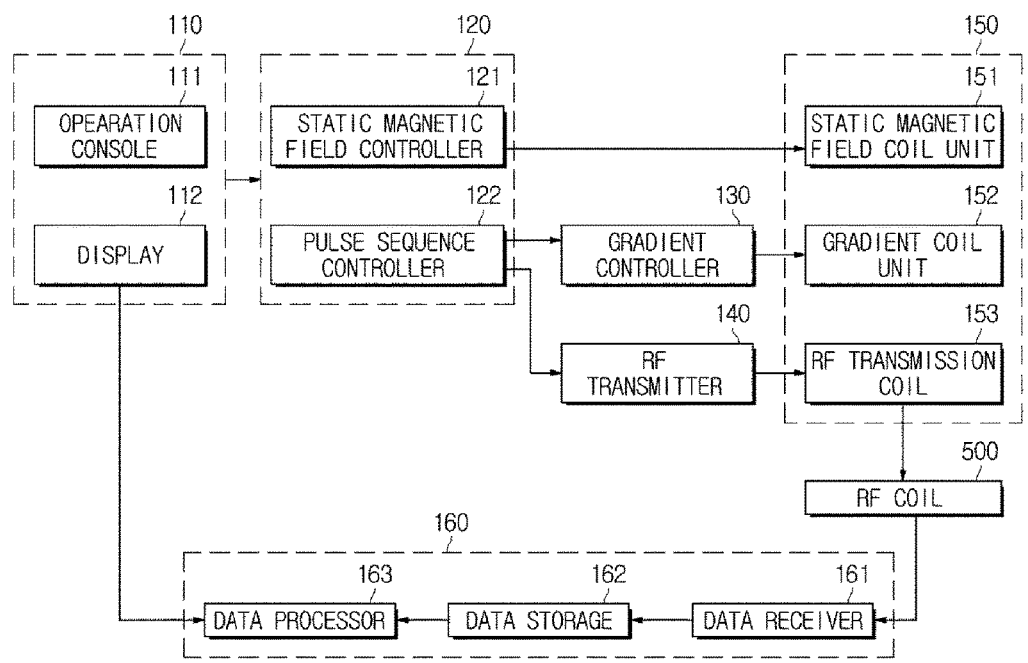
FIG. 1 is a control block diagram of an MRI apparatus in accordance with an embodiment of the present disclosure.

FIG. 1 is a control block diagram of an MRI apparatus in accordance with an embodiment of the present disclosure. Hereinafter a motion of an MRI apparatus will be generally described with reference to FIG. 1. Particularly, it is assumed that an RF coil is separated from a magnetic assembly.

As illustrated in FIG. 1, the MRI apparatus in accordance with an embodiment may include a magnetic assembly 150 forming a magnetic field and generating resonance of atomic nuclei, a controller 120 controlling the operation of the magnetic assembly 150, and an image processor 160 receiving an echo signal, i.e., an MR signal, generated from the atomic nuclei and generating an MR image. In addition, the MRI apparatus may include an RF coil 500 receiving an MR signal generated by the magnetic assembly 150, and transmitting the MR signal to the image processor 160.

The magnetic assembly 150 may include a static magnetic field coil unit 151 forming a static magnetic field in the inner space thereof, a gradient coil unit 152 generating gradients in the static magnetic field and forming gradient magnetic fields, and a radio frequency (RF) receiving coil 153 applying an RF pulse. That is, when a target object is located in the inner space of the magnetic assembly 150, the static magnetic field, the gradient magnetic fields and the RF pulse may be applied to the object, and thus, atomic nuclei of the object may be excited and an echo signal may be generated from the atomic nuclei.

The RF coil 500 may receive electromagnetic waves emitted from excited atomic nuclei, i.e. an MR signal. The RF coil 500 may play a role of an antenna receiving an RF signal emitted from an object. The RF coil 500 may be used while being attached to a body, and thus the RF coil 500 may be formed to have a shape of part of body, e.g. head coil, neck coil, and waist coil.

An example of the RF coil 500 detachable from the magnetic assembly 150 is a surface coil configured to receive an MR signal, which is excited in a part of object. Because the surface coil has a relative smaller size than a volume coil, and has a two dimensional surface, the surface coil has a greater signal to noise ratio (SNR) about an adjacent part.

An example of the RF coil 500 is an array coil expanding a receive region by arranging a plurality of surface coils in one or two dimensions. The array coil may have various array shapes according to an examined part, and thus may be classified into head type, head and neck type, chest type, spine type, abdomen type, and leg type. Because a relative position of each surface coil forming the array coil is different, there may be differences in the phase of signal, which is received by each surface coil. Therefore, when reconstructing an image by synthesizing signals received by the each surface coil, the receive phase of the surface coil may be considered thereby acquiring an image with a high SNR.

The controller 120 may include a static magnetic field controller 121 controlling the intensity and direction of the static magnetic field formed by the static magnetic field coil unit 151, and a pulse sequence controller 122 designing a pulse sequence and controlling the gradient coil unit 152 and the RF transmission coil 153 based on the pulse sequence.

The MRI apparatus may include a gradient controller 130 applying a gradient signal to the gradient coil unit 152 and an RF transmitter 140 applying an RF signal to the RF transmission coil 153, and thus the pulse sequence controller 122 may control the gradient controller 130 and the RF transmitter 140 to adjust the gradient magnetic field formed in the inner space of the magnetic assembly 150 and the RF applied to the atomic nuclei.

The RF coil 500 may be connected to the image processor 160. The image processor 160 may include a data receiver 161 receiving data regarding a spin echo signal, i.e., an MR signal, generated from the atomic nuclei, and generating an MR image by processing the MR signal, a data storage 162 storing data received by the data receiver 161, and a data processor 163 generating an MR image by processing the data stored in the data storage 162.

The data receiver 161 may include a pre-amplifier (not shown) amplifying the MR signal received by the RF coil 500, a phase detector (not shown) receiving the MR signal transmitted from the pre-amplifier and then detecting a phase, and an A/D converter (not shown) converting an analog signal acquired through phase detection into a digital signal. Further, the data receiver 161 may transmit the MR signal converted into the digital signal to the data storage 162.

A data space constructing a two-dimensional (2D) Fourier space may be formed in the data storage 162, and when storing overall data is completed, wherein the overall data is completely scanned, the data processor 163 may reconfigure the image of the object by performing 2D inverse Fourier transform upon data in the 2D Fourier space. The reconfigured image may be displayed on a display 112.

Further, the MRI apparatus may include a user operation unit 110, and may receive control instructions regarding the overall operation of the MRI apparatus from a user and, particularly, receive instructions regarding a scan sequence from the user and generate a pulse sequence thereby.

The user operation unit 110 may include an operation console 111 provided to allow a user to operate a system, and the display 112 displaying a control state and displaying the image generated by the image processor 160 to allow the user to diagnose the health state of the object.

Figure 2:
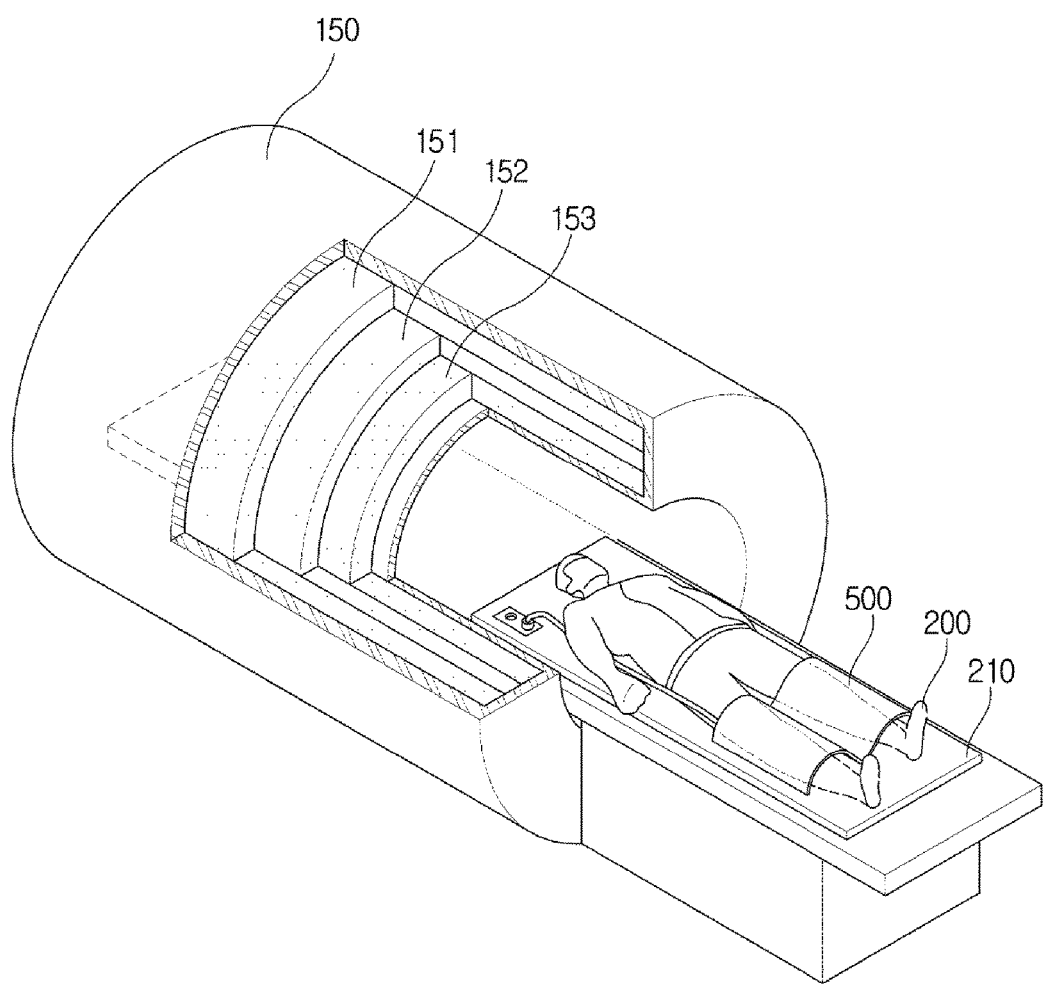
FIG. 2 is a view schematically illustrating an external appearance of an MRI apparatus in accordance with an embodiment of the present disclosure.

FIG. 2 is a view schematically illustrating an external appearance of an MRI apparatus in accordance with an embodiment of the present disclosure.

As illustrated in FIG. 2, the magnetic assembly 150 has a cylindrical shape, an inner space of which is void, and may be referred to as a gantry or a bore. The inner space of the magnetic assembly may be referred to as a cavity, and a patient table 210 may transfer an object 200 positioned thereon to the cavity to acquire an MR signal.

The magnetic assembly 150 may include the static magnetic field coil unit 151, the gradient coil unit 152, and the RF transmission coil 153.

The static magnetic field coil unit 151 may be formed in a shape in which a coil is wound around the cavity, and when current is applied to the static magnetic field coil unit 151, a static magnetic field may be formed at the inner space of the magnetic assembly 150, i.e., in the cavity. Particularly, when the static magnetic field is formed in the cavity, atomic nuclei of atoms constituting the object 200, particularly, hydrogen atoms may be arranged in the direction of the static magnetic field and execute precession in the direction of the static magnetic field.

The gradient coil unit 152 may generate gradients in the static magnetic field formed in the cavity thereby forming gradient magnetic fields.

Figure 3:
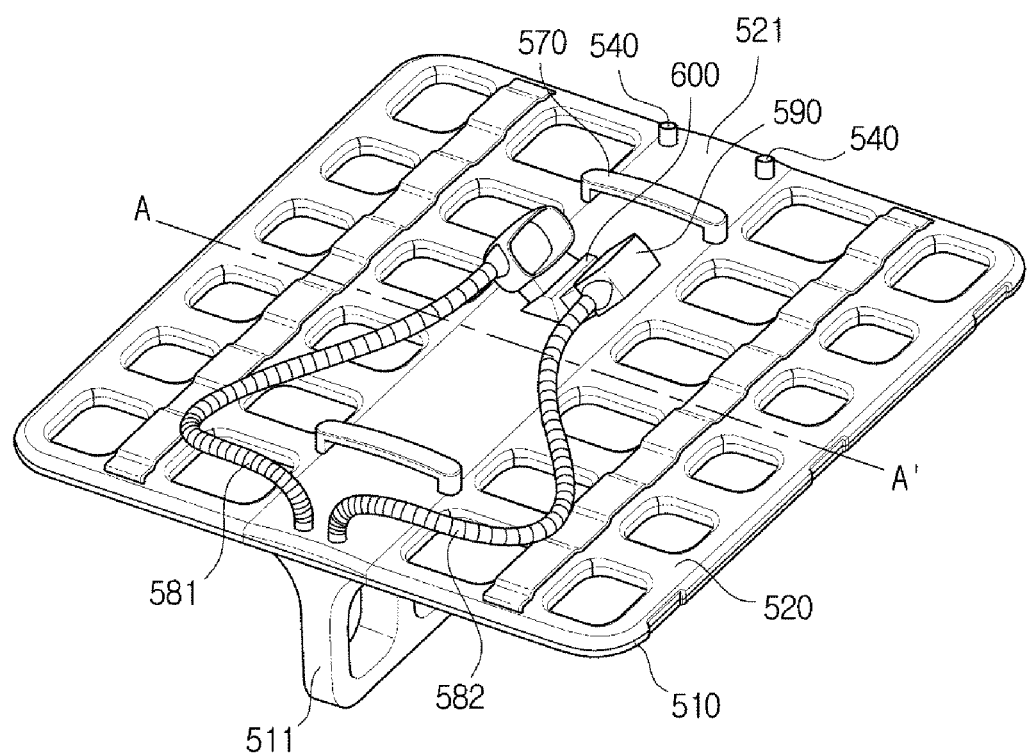
FIG. 3 is a perspective view illustrating an RF coil in accordance with an embodiment of the present disclosure.
Figure 4A:
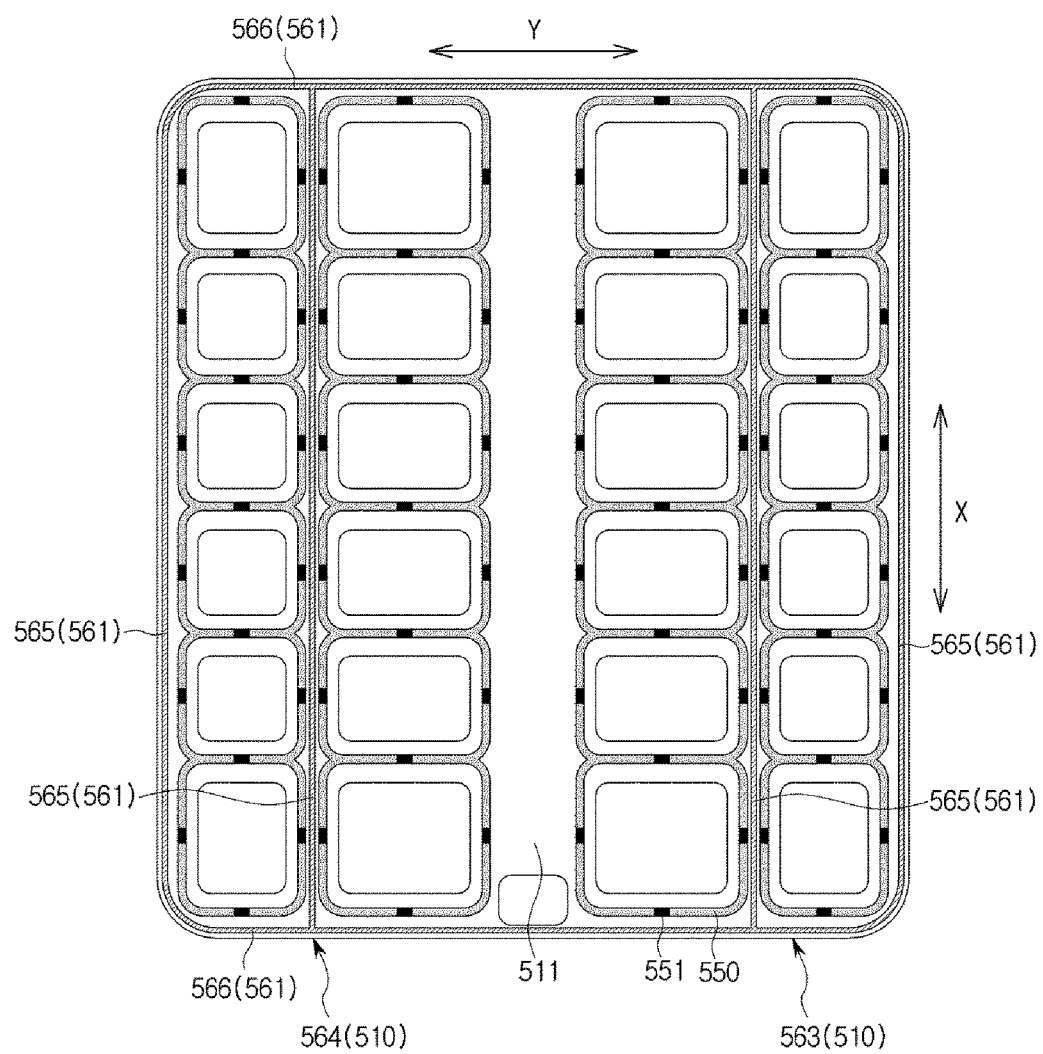
FIGS. 4A and 4B are views a perspective view illustrating an RF coil, in which a second cover is omitted, in accordance with an embodiment of the present disclosure.
Figure 4B:
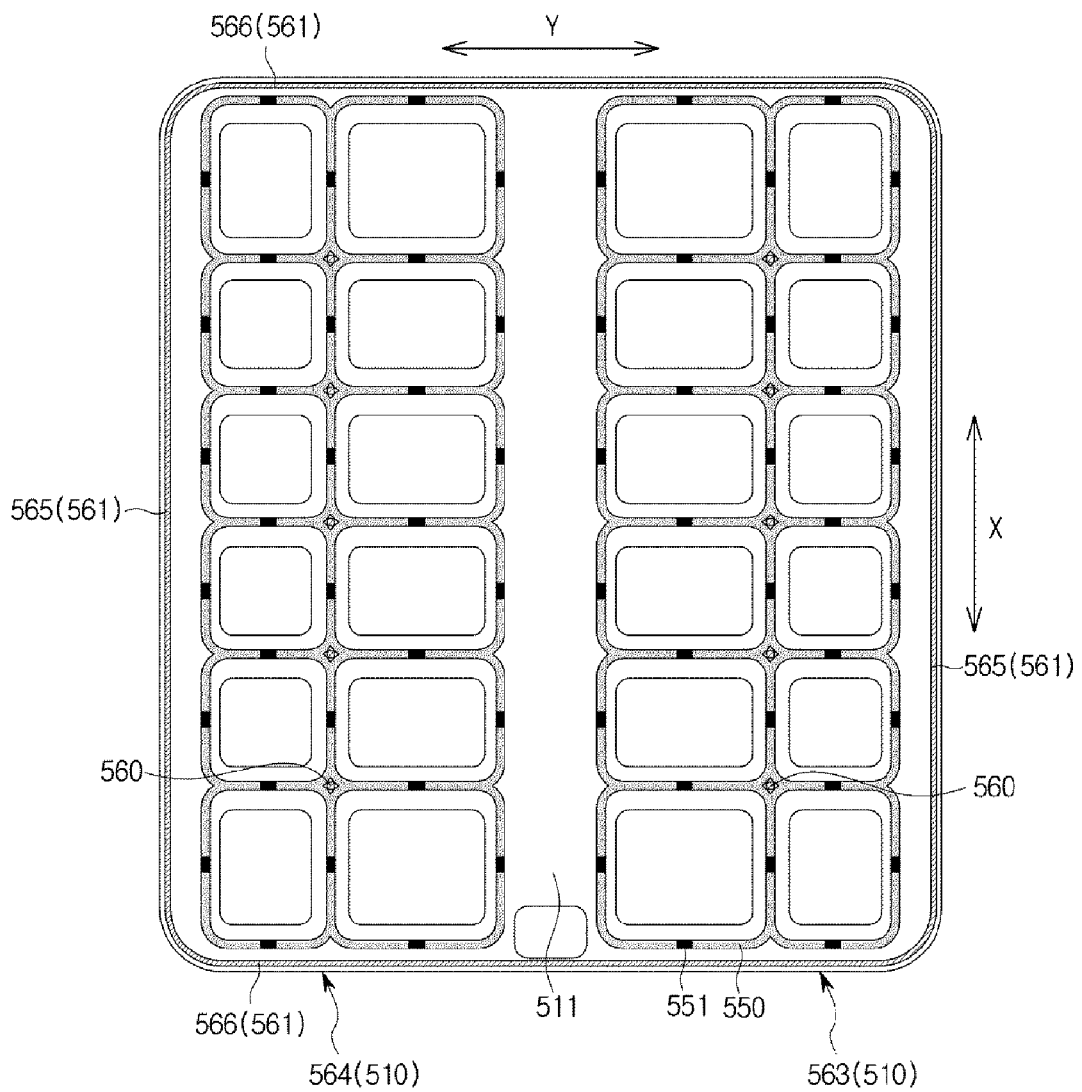
Figure 5:
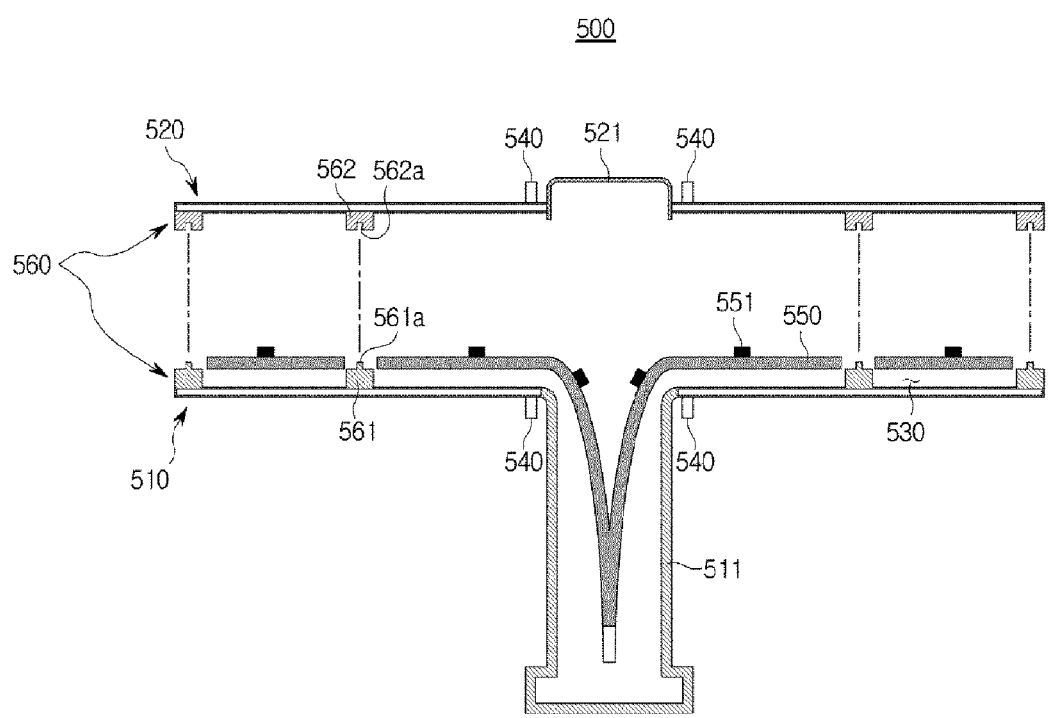
FIG. 5 is a sectional view taken along line A-A' of the RF coil of FIG. 3 in accordance with an embodiment, particularly a view illustrating a process of coupling a first cover to a second cover.

FIG. 3 is a perspective view illustrating an RF coil in accordance with an embodiment of the present disclosure, and FIGS. 4A and 4B are views a perspective view illustrating an RF coil, in which a second cover is omitted, in accordance with an embodiment of the present disclosure. FIG. 5 is a sectional view taken along line A-A' of the RF coil of FIG. 3 in accordance with an embodiment, particularly a view illustrating a process of coupling a first cover to a second cover. Particularly, for convenience of description, a first coupling unit 565 and a second coupling unit 566 are illustrated in FIGS. 4 A and 4B, but the first coupling unit 565 may represent a first coupling part 561 of the first coupling unit 565 and the second coupling unit 566 may represent a first coupling part 561 of the second coupling unit 566. That is, the first coupling part 561 and the second coupling part 562 may be commonly called the first coupling unit 565 and the second coupling unit 566, respectively, but in FIGS. 4A and 4B, for convenience of description, the first coupling part 561 of the first coupling unit 565 and the first coupling part 561 of the second coupling unit 566 may represent the first coupling unit 565 and the second coupling unit 566, respectively.

As illustrated in FIGS. 3 to 5, the RF coil 500 may include a first cover 510 and a second cover 520.

The first cover 510 and the second cover 520 may be spaced apart from each other to face to each other.

The first cover 510 and the second cover 520 may be disposed to form an inner space between the first cover 510 and the second cover 520.

The first cover 510 and the second cover 520 may form an external appearance of the RF coil 500.

Thermal insulation material may be injected into the inside of at least one of the first cover 510 and the second cover 520. Particularly, thermal insulation material may be injected into the inside of both of the first cover 510 and the second cover 520.

At least one of the first cover 510 and the second cover 520 allowing the injection of thermal insulation material may include at least one thermal insulation material nozzle 540. Thermal insulation material may be injected into at least one of the first cover 510 and the second cover 520 through the at least one thermal insulation material nozzle 540. However, according to the kind of thermal insulation material, thermal insulation material may be not injected into at least one of the first cover 510 and the second cover 520 through the at least one of thermal insulation material nozzle 540. When thermal insulation material is injected into the inside of both of the first cover 510 and the second cover 520, the first cover 510 and the second cover 520 may each include at least one thermal insulation material nozzle 540, respectively. The at least one thermal insulation material nozzle 540 may protrude outward of the RF coil 500. However, the shape of the at least one thermal insulation material nozzle 540 is not limited thereto, and thus may be modified in various shapes.

The thermal insulation material may include fluid insulation material. The fluid insulation material may include air. Because air is not harmful to the human body and also readily available, air may be proper for the fluid insulation material in consideration with the ease of usability. However, the kind of thermal insulation material is not limited thereto, and thus any kind of thermal insulation material may be applied to the RF coil 500 as long as it is not harmful to the human body. For example, nitrogen gas, helium gas, and foam polystyrene, may be used for thermal insulation material.

The first cover 510 and the second cover 520 may be flexible to be bent or curved to fit the shape of an object, which is intended to be scanned.

At least one of the first cover 510 and the second cover 520 may be formed by synthetic resin. Synthetic resin may include at least one of Polyvinyl chloride (PVC) and Teflon. Because Polyvinyl chloride (PVC) and Teflon (Teflon) are not harmful to the human body, and have high workability, the first cover 510 and the second cover 520 may be formed of Polyvinyl chloride (PVC) and Teflon. Particularly, the first cover 510 and the second cover 520 may be produced in thin plate shape by using at least one of Polyvinyl chloride (PVC) and Teflon so that the flexibility thereof may be secured. When the first cover 510 and the second cover 520 are thick, it may be hard to bend or curve the RF coil 500 to fit the shape of the object.

The RF coil 500 may further include a circuit board 550. The circuit board 550 may be disposed in an inner space 530. The circuit board 550 may include Flexible Copper Clad Laminate (FPCB). Although it is described later, the RF coil 500 may be bent or curved to be fit the shape of the object, and thus Flexible Copper Clad Laminate (FPCB) may be used as the circuit board 550 disposed in the inner space 50. However, the kind of the circuit board 550 is not limited thereto.

A circuit element 551 receiving an RF signal may be mounted to the circuit board 550. The circuit element 551 receiving an RF signal may include an inductor, and a capacitor.

The first cover 510 and the second cover 520 may be detachably coupled to each other.

The RF coil 500 may further include at least one coupling unit 560 detachably coupling the first cover 510 to the second cover 520.

The at least one coupling unit 560 may detachably couple the first cover 510 to the second cover 520 so that foreign material, e.g. blood, may be prevented from being introduced to the inner space 530, in order to prevent the circuit board 550 or the circuit element 551, which are disposed in the inner space 530, from being contaminated by foreign material, e.g. blood.

On the other side, the at least one coupling unit 560 may detachably couple the first cover 510 to the second cover 520 to close the inner space 530.

At least one of the first cover 510 and the second cover 520 may include a rigid unit 511 and 521. The rigid unit 511 and 521 may include a first rigid unit 511 extended from the first cover 510 toward the lower side. The first rigid unit 511 may be inserted between the legs when a part of body in which the RF coil 500 is attached, is the legs. The rigid unit 511 and 521 may include a second rigid unit 521 provided in the second cover 520. In the second rigid unit 521, a handle 570 and a connector compartment 600 may be provided, described later. The rigid unit 511 and 521 may be formed of material having relatively higher strength than the rest of the first cover 510 and the second cover 520.

The at least one coupling unit 560 may include the first coupling part 561 and the second coupling part 562. The first coupling part 561 may be formed on any one of the first cover 510 and the second cover 520, and may have a protrusion unit 561a. The second coupling part 562 may be formed on the other of the first cover 510 and the second cover 520, and may have a connecting groove 562a to which the protrusion unit 561a is coupled.

The first coupling part 561 may be integrally formed with any one of the first cover 510 and the second cover 520. The second coupling part 562 may be integrally formed with the other of the first cover 510 and the second cover 520. Otherwise, the first coupling part 561 may be provided in any one of the first cover 510 and the second cover 520, as a member separated from the first cover 510 and the second cover 520. The second coupling part 562 may be provided in the other of the first cover 510 and the second cover 520 as a member separated from the first cover 510 and the second cover 520.

The arrangement or the array structure of the at least one coupling unit 560 may be as follows.

The at least one coupling unit 560 may be disposed along at least one portion of an edge of the RF coil 500. The at least one coupling unit 560 may continuously disposed along at least one of an edge portion of the RF coil 500. Hereinafter a case in which the first coupling part 561 is provided in the first cover 510, and the second coupling part 562 is provided in the second cover 520 will be mainly described.

For example, the first coupling part 561 may be disposed along at least one portion of an edge of the first cover 510. The first coupling part 561 may be disposed along an edge of the first cover 510 except the first rigid unit 511. For convenience of description, a portion disposed on the right side of the first cover 510 with respect to the first rigid unit 511 may represent a first portion 563 of the first cover 510, and a portion disposed on the left side of the first cover 510 of the first rigid unit 511 may represent a second portion 564 of the first cover 510. For convenience of description, one edge portion of the first portion 563 facing the first rigid unit 511 may represent a first edge portion, and one edge portion of the second portion 564 facing the first rigid unit 511 may represent a second edge portion. The first coupling part 561 may be disposed along the rest edge portion of the first portion 563 except the first edge portion, and the second portion 564 except the second edge portion. Alternatively, the first coupling part 561 may be disposed along all edge portion of the first portion 563 including the first edge portion and the second portion 564 including the second portion. The second coupling unit 562 may be provided in the second cover 520 to correspond to the first coupling part 561. Above, a case in which the first coupling part 561 is disposed along the edge portion of the first cover 510 except the first rigid unit 511 is mainly described, but a case the first coupling part 561 is disposed along all edge portion of the first cover 510 including the first rigid unit 511 may be allowed.

On the other side, the at least one coupling unit 560 may include at least one first coupling unit 565 in parallel with one edge portion of the RF coil 500 in a first direction (X). The at least one coupling unit 560 may further include at least one second coupling unit 566 in parallel with the other edge portion of the RF coil 500 in a second direction (Y). That is, a single first coupling unit 565 may be disposed on one edge portion of the RF coil 500 in the first direction (X), and also a plurality of first coupling units 565 may be disposed in a multiple manner in a way of being disposed on one edge portion of the RF coil 500 in the first direction (X) while being disposed inward of the RF coil 500 from the one edge portion of the 500 coil. Like the first coupling unit 565, the second first coupling unit 566 may be disposed on the other edge portion of the RF coil 500 in the second direction (Y), and also a plurality of second coupling units 566 may be disposed in a multiple manner in a way of being disposed on the other edge portion of the RF coil 500 in the second direction (Y) while being disposed inward of the RF coil 500 from the other edge portion of the RF coil 500. The first coupling unit 565 or the second coupling unit 566 disposed in the inside of the RF coil 500 may be continuously or discontinuously disposed. Above, a case in which the at least one coupling unit 560 disposed in the inside of the RF coil 500 is formed in a shape of line is mainly described, but the at least one coupling unit 560 disposed in the inside of the RF coil 500 may be formed in a shape of dot. FIG. 4A illustrates that the at least one coupling unit 560 disposed in the inside of the RF coil 500 is formed in the shape of a line, and FIG. 4B illustrates that the at least one coupling unit 560 disposed in the inside of the RF coil 500 is formed in the shape of a dot.

The RF coil 500 may further include the handle 570 so that the RF coil 500 may be easily moved. The handle 570 may be provided in the rigid unit 511 and 521 provided in at least one of the first cover 510 and the second cover 520. Particularly, the handle 570 may be provided in the second rigid unit 521.

The RF coil 500 may further include a cable 581 and 582. Particularly, the cable 581 and 582 may include a first cable 581 electrically connecting the RF coil 500 to power source and a second cable 582 electrically connecting the RF coil 500 to the image processor 160 (refer to FIG. 1). The second cable 582 may be configured to transmit a signal of the image processor 160 (refer to FIG. 1) to the RF coil 500. A connector 590 may be provided on an end portion of the cable 581 and 582. The connector 590 may be detachably placed in the connector compartment 600. The connector compartment 600 may be provided in the second rigid unit 521, but the position of the connector compartment 600 is not limited thereto.

The RF coil 500 may include a first thermal insulation material container, a second thermal insulation material container, a circuit board 500. The second thermal insulation material container may be disposed in the inside of the first thermal insulation material container. The circuit board 550 may be disposed in the inside of the second thermal insulation material container, and the circuit element 551 receiving an RF signal may be mounted on the circuit board 550.

At least one thermal insulation material nozzle 540 may be provided in the first thermal insulation material container so that thermal insulation material may be injected into the first thermal insulation material container.

The first thermal insulation material container may include at least one of Polyvinyl chloride (PVC) and Teflon.

Thermal insulation material may include air.

Above, the first thermal insulation material container may be include the first cover 510 and the second cover 520, and the second thermal insulation material container may include the inner space 530.

Figure 6:
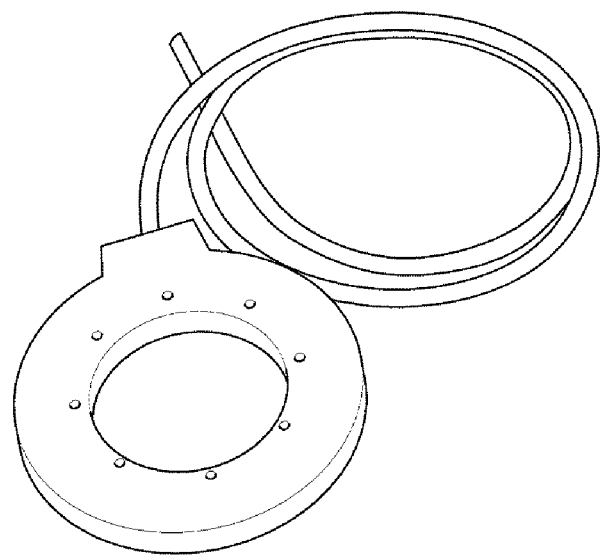
FIG. 6 is a perspective view illustrating an RF coil in accordance with an embodiment of the present disclosure.
Figure 7:
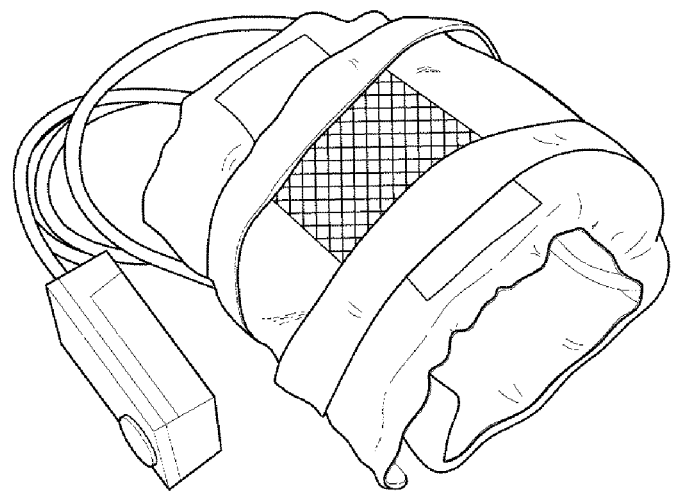
FIG. 7 is a perspective view illustrating an RF coil in accordance with an embodiment of the present disclosure.

FIG. 6 is a perspective view illustrating an RF coil in accordance with an embodiment of the present disclosure and FIG. 7 is a perspective view illustrating an RF coil in accordance with an embodiment of the present disclosure.

As illustrated in FIGS. 6 and 7, the present disclosure may be applied to a variety of RF coils 500. That is, the present disclosure may be applied to a flex coil 500b, as illustrated in FIG. 7 as well as a loop coil 500a, as illustrated in FIG. 6. The loop coil 500a and the flex coil 500b are an example of the RF coil 500 in which the present disclosure is applied and thus the kind of the RF coil applied by the present disclosure is not limited thereto.

The present disclosure may be applied to an array coil as well as a surface coil.

The RF coil 500 may include Peripheral Vascular (PV) coil, but the kind of the RF coil 500 is not limited thereto.

As is apparent from the above description, according to the proposed RF coil and the MRI apparatus including the same, by injecting thermal insulation material into at least one of a first cover and a second cover, heat generated in an RF coil may be prevented from being directly transferred to an object.

By preventing heat generated in an RF coil from being directly transferred to an object, an amount of sweat discharged from an object may be reduced, and thus the distortion of an MRI image caused by the sweat of the object may be prevented.

Because a first cover and a second cover are configured to be detachable from each other, when a problem occurs in a circuit element of the RF coil, the circuit element may be easily repaired by separating the first cover and the second cover from each other By applying at least one coupling unit, which is configured to couple the first cover to the second cover so that an inner space between the first cover and the second cover is closed, to the RF coil, it may be possible to prevent foreign material, e. g. blood, from being introduced into the inner space.

By using at least one thermal insulation material nozzle or by separating the first cover and the second cover, thermal insulation material may be injected into at least one of the first cover and the second cover, and a separate circulation system configured to circuit the injected thermal insulation material may be omitted, thereby improving the usability of the RF coil.

Although the embodiments of the present disclosure have been shown and described, it would be appreciated by those skilled in the art that changes may be made in these embodiments without departing from the principles and spirit of the invention, the scope of which is defined in the claims and their equivalents.

What is claimed is:

1. A magnetic resonance imaging (MRI) apparatus comprising:
    an RF coil configured to receive an RF signal, and including:
        a first cover configured to receive injectable thermal insulation material therein;
        a second cover configured to receive injectable thermal insulation material therein, and detachably couple to the first cover;
        an inner space formed between the first cover and the second cover to receive thermal insulation material therein;
        at least one thermal insulation material nozzle formed at at least one of the first cover and the second cover such that thermal insulation material is injected into the at least one of the first cover and the second cover through the at least one thermal insulation material nozzle; and
    at least one circuit board disposed in the inner space and including a circuit element configured to receive the RF signal.

2. The MRI apparatus of claim 1, wherein
the RF coil further includes at least one coupling unit configured to detachably couple the first cover to the second cover.

3. The MRI apparatus of claim 2, wherein
the at least one coupling unit includes a first coupling part formed on any one of the first cover and the second cover, and provided with a protrusion, and
a second coupling part formed on the other of the first cover and the second cover, and provided with a connecting groove to which the protrusion is coupled.

4. The MRI apparatus of claim 3, wherein
the first coupling part is integrally formed with any one of the first cover and the second cover, and
the second coupling part is integrally formed with the other of the first cover and the second cover.

5. The MRI apparatus of claim 2, wherein
the at least one coupling unit is disposed along at least one portion of an edge of the RF coil.

6. The MRI apparatus of claim 5, wherein
the at least one coupling unit is continuously disposed along the at least one portion of the edge of the RF coil.

7. The MRI apparatus of claim 1, wherein
the first cover and the second cover are bendable to fit the shape of an object to be scanned.

8. The MRI apparatus of claim 1, wherein
at least one of the first cover and the second cover includes at least one of Polyvinyl chloride (PVC) and Teflon.

9. The MRI apparatus of claim 1, wherein
at least one of the first cover and the second cover includes a rigid unit including a handle.

10. An apparatus for a magnetic resonance imaging machine, the apparatus comprising:
    a first cover configured to receive injectable thermal insulation material therein;
    a second cover detachably couplable to the first cover to form a gap between the first cover and the second cover, and configured to receive injectable thermal insulation material therein;
    a circuit element configured to receive a magnetic resonance signal generated by a magnetic assembly in the magnetic resonance imaging machine, and provided in the gap formed between the first cover and the second cover; and
    a thermal insulation material provided between the first cover and the circuit element to reduce heat transfer from the circuit element to the first cover.

* * * * *